United States Patent
Kamada

(10) Patent No.: US 9,088,010 B2
(45) Date of Patent: Jul. 21, 2015

(54) ORGANIC EL ILLUMINATING APPARATUS

(75) Inventor: Hideki Kamada, Yonezawa (JP)

(73) Assignee: LUMIOTEC INC., Yonezawa-Shi (JP)

( * ) Notice: Subject to any disclaimer, the term of this patent is extended or adjusted under 35 U.S.C. 154(b) by 90 days.

(21) Appl. No.: 13/578,205

(22) PCT Filed: Feb. 10, 2011

(86) PCT No.: PCT/JP2011/052815
§ 371 (c)(1), (2), (4) Date: Aug. 9, 2012

(87) PCT Pub. No.: WO2011/099542
PCT Pub. Date: Aug. 18, 2011

(65) Prior Publication Data
US 2012/0306373 A1 Dec. 6, 2012

(30) Foreign Application Priority Data
Feb. 10, 2010 (JP) ................ 2010-027284

(51) Int. Cl.
*G05F 1/00* (2006.01)
*H01L 51/56* (2006.01)
(Continued)

(52) U.S. Cl.
CPC .............. *H01L 51/56* (2013.01); *G09G 3/3208* (2013.01); *H05B 33/0896* (2013.01); *G09G 2330/027* (2013.01); *G09G 2330/12* (2013.01); *H01L 2251/5392* (2013.01)

(58) Field of Classification Search
USPC ......... 315/88, 89, 91, 93, 112, 113, 119, 121, 315/123, 125, 127, 128, 193, 291, 294, 297, 315/299, 300, 301, 302, 306, 307, 308, 309, 315/310, 312, 313, 315, 322, 320, 362
See application file for complete search history.

(56) References Cited

U.S. PATENT DOCUMENTS

2007/0159085 A1* 7/2007 Kuma et al. ................... 313/506
2008/0150436 A1* 6/2008 Suzuki ........................ 315/169.3
(Continued)

FOREIGN PATENT DOCUMENTS

JP 2000-348861 A 12/2000
JP 2004-39291 A 2/2004
(Continued)

OTHER PUBLICATIONS

Extended European Search Report dated Mar. 19, 2014.
(Continued)

*Primary Examiner* — Douglas W Owens
*Assistant Examiner* — Jianzi Chen
(74) *Attorney, Agent, or Firm* — Birch, Stewart, Kolasch & Birch, LLP

(57) ABSTRACT

Disclosed is an organic EL illuminating apparatus which can detect a short-circuit when the short-circuit is generated in one area between the anode and the cathode. The organic EL illuminating apparatus is provided with: an organic EL illuminating device (1); a drive circuit (2) which turns on the organic EL illuminating device (1); an illuminance detection monitor (3) which monitors the lighting state of the organic EL illuminating device (1); and a monitor detection signal feedback circuit (4) which makes the drive circuit (2) turn off the organic EL illuminating device (1), on the basis of monitor information obtained from the illuminance detection monitor (3).

3 Claims, 2 Drawing Sheets

(51) Int. Cl.
   *H05B 33/08*  (2006.01)
   *G09G 3/32*   (2006.01)

(56) References Cited

U.S. PATENT DOCUMENTS

| | | |
|---|---|---|
| 2008/0152950 A1 | 6/2008 | Je et al. |
| 2010/0045193 A1 | 2/2010 | Konishi et al. |

FOREIGN PATENT DOCUMENTS

| | | |
|---|---|---|
| JP | 2005-149744 A | 6/2005 |
| JP | 2007-10969 A | 1/2007 |
| JP | 2007-227094 A | 9/2007 |
| JP | 2007-257898 A | 10/2007 |
| JP | 2008-130513 A | 6/2008 |
| JP | 2008-270248 A | 11/2008 |
| JP | 2009-70744 A | 4/2009 |
| JP | 2009-164318 A | 7/2009 |
| JP | 2009-238434 A | 10/2009 |
| JP | 2009-252454 A | 10/2009 |
| WO | WO 2009/095850 A1 | 8/2009 |

OTHER PUBLICATIONS

Office Action dated Sep. 9, 2014 for corresponding Japanese Application No. 2011-553879.
Office Action dated Dec. 2, 2014 for corresponding Japanese Application No. 2011-553879.

* cited by examiner

ORGANIC EL ILLUMINATING APPARATUS

TECHNICAL FIELD

The present invention relates to an organic EL illuminating apparatus.

BACKGROUND ART

A constant, direct current drive method is generally employed as a drive method for driving organic EL illuminating devices for light emission. To cause an organic EL illuminating device having a light-emission area of 15 cm square or larger to emit light with a luminance of about 5000 cd/m$^2$, a current with a value of the order of amperes or more needs to be applied on the device. Meanwhile, an inter-electrode resistance between anode and cathode in a non-defective organic EL illuminating device of the above size ordinarily has a value of several MΩ or more; however, the inter-electrode resistance value becomes several tens Ω or less if a short-circuit occurs in a portion between anode and cathode.

PRIOR ART DOCUMENT

Patent Document

Patent Document 1: Japanese Patent Application Publication No. 2007-227094

SUMMARY OF THE INVENTION

Problems to be Solved by the Invention

When a current-driven organic EL illuminating device as a surface-emitting light source emits light normally over the entire light-emitting surface, a current is also distributed over the entire light-emitting surface and flows in a vertical direction. Hence, the amount of current per unit area (cm$^2$) is of the order of milli-amperes although the total amount of current is of the order of amperes.

However, when a short-circuit of the order of several tens occurs in a portion between anode and cathode due to conductive foreign objects or the like, all of the current having been distributed and flowing through the entire surface of the organic EL illuminating device concentrates in the portion of the short-circuit. Then, the Joule heat generated in this event causes a drastic temperature rise. Moreover, if a flammable component is in contact with the portion of this temperature rise, there is a risk of the component being ignited in the worst case.

In consideration of the above, an object of the present invention is to provide an organic EL illuminating apparatus capable of detecting a short-circuit when the short-circuit occurs in a portion between anode and cathode.

Means for Solving the Problems

An organic EL illuminating apparatus of a first aspect of the present invention which solves the problems described above includes an organic EL illuminating device and is characterized in that the organic EL illuminating apparatus comprises: drive means for driving the organic EL illuminating device; monitoring means for monitoring a driven state of the organic EL illuminating device; and feedback means for making the drive means turn off the organic EL illuminating device on the basis of monitoring information obtained by the monitoring means.

An organic EL illuminating apparatus of a second aspect of the present invention which solves the problems described above is the organic EL illuminating apparatus of the first aspect characterized in that the organic EL illuminating device has a light-emission area of 20 cm$^2$ or larger and emits light with a luminance of 1000 cd/m$^2$ or higher.

An organic EL illuminating apparatus of a third aspect of the present invention which solves the problems described above is the organic EL illuminating apparatus of the first aspect characterized in that the organic EL illuminating device has a light-emission area of 10 cm square or larger and emits light with a luminance of 1000 cd/m$^2$ or higher.

An organic EL illuminating apparatus of a fourth aspect of the present invention which solves the problems described above is the organic EL illuminating apparatus of the first aspect characterized in that an illuminance detection monitor is used as the monitoring means.

Effect of the Invention

The present invention can provide an organic EL illuminating apparatus capable of detecting a short-circuit when the short-circuit occurs in a portion between anode and cathode.

MODES FOR CARRYING CUT THE INVENTION

Hereinbelow, embodiments of an organic EL illuminating apparatus according to the present invention will be described with reference to the drawings.

In an organic EL illuminating device which is driven with a constant current drive, whether the organic EL illuminating device is driven normally can be checked by monitoring the driven state, such as illuminance, of the organic EL illuminating device. For example, if a short-circuit occurs in a portion between anode and cathode in the organic EL illuminating device, illuminance decreases with an increase in a leak current and the device becomes non-driven once the leak current reaches a certain level or greater. The monitoring of the driven state of the organic EL illuminating device enables detecting a short-circuit as an anomaly when the short-circuit occurs in a portion between anode and cathode.

Thus, the organic EL illuminating apparatus according to the present invention uses monitoring means which is capable of detecting a short-circuit as an anomaly when the short-circuit occurs in a portion between anode and cathode by monitoring the driven state of an organic EL illuminating device. For example, an illuminance monitor is used as the monitoring means because illuminance decreases drastically when a short-circuit occurs in a portion. A drastic decrease in illuminance is monitored by the illuminance monitor, this monitoring information is fed back to a drive circuit of the organic EL illuminating device, and a current supplied to the organic EL illuminating device is cut off in the case of anomaly.

First Embodiment

Hereinbelow, a first embodiment of the organic EL illuminating apparatus according to the present invention will be described.

First of all, the configuration of the organic EL illuminating apparatus according to this embodiment will be described.

Figure 1:
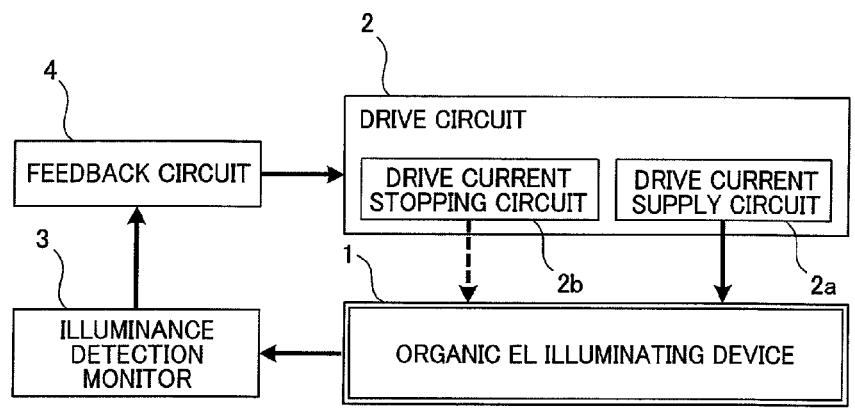
FIG. 1 is a schematic diagram showing a configuration of an organic EL illuminating apparatus according to a first embodiment of the present invention.

As shown in FIG. 1, the organic EL illuminating apparatus according to this embodiment includes: an organic EL illuminating device 1; a drive circuit 2 which drives the organic EL illuminating device 1; an illuminance detection monitor 3 which detects the illuminance of the organic EL illuminating device 1; and a monitor detection signal feedback circuit 4 which outputs a signal to the drive circuit 2 on the basis of a signal from the illuminance detection monitor 3. Moreover, the drive circuit 2 includes a drive current supply circuit 2a and a drive current stopping circuit 2b.

Note that, the organic EL illuminating apparatus according to this embodiment uses the organic EL illuminating device 1 which has a light-emission area of 10 cm square or larger and emits light with a luminance of 1000 cd/m² or higher. This is because anomaly detection is particularly important for the organic EL illuminating device 1 which has a certain degree of size and emits light with a high luminance.

Further, the organic EL illuminating apparatus according to this embodiment may use the organic EL illuminating device 1 which has a rectangular light-emission area (4×5 cm², 4×26 cm², 5×26 cm², 7×26 cm², for example) and emits light with a luminance of 1000 cd/m² or higher, particularly the organic EL illuminating device 1 which has a small light-emission area such as 4×5 cm² but emits light with an extremely high luminance such as 5000 to 10000 cd/m² or higher. This is because anomaly detection is particularly important also for such an organic EL illuminating device 1.

Next, the operation of the organic EL illuminating apparatus according to this embodiment will be described.

The organic EL illuminating apparatus according to this embodiment drives the organic EL illuminating device 1 by making the drive current supply circuit 2a of the drive circuit 2 supply a rated current to the organic EL illuminating device 1. In addition, the organic EL illuminating apparatus according to this embodiment makes the illuminance detection monitor 3 monitor the illuminance of the driven organic EL illuminating device 1.

When a short-circuit occurs in a portion between anode and cathode in the organic EL illuminating device 1 due to some reason, the illuminance of the organic EL illuminating device 1 drastically decreases. In the organic EL illuminating apparatus according to this embodiment, the illuminance detection monitor 3 which monitors the illuminance of the organic EL illuminating device 1 sends an illuminance decrease signal to the monitor detection signal feedback circuit 4 when the illuminance detection monitor 3 detects an illuminance of a predetermined value or lower.

Further, the monitor detection signal feedback circuit 4 sends an illuminance decrease signal to the drive circuit 2. Upon receipt of this signal, the drive circuit 2 makes the drive current stopping circuit 2b of the drive circuit 2 send a drive stop signal to the organic EL illuminating device 1 to turn off the organic EL illuminating device 1.

With the configuration described above, the organic EL illuminating apparatus according to this embodiment can detect a short-circuit as an anomaly when the short-circuit occurs in a portion between anode and cathode. This can prevent accidents such as a fire accident due to the Joule heat generated when an overload current is kept supplied to the organic EL illuminating device 1 in a state where there is a short-circuit in a portion of the device 1.

Second Embodiment

Hereinbelow, a second embodiment of the organic EL illuminating apparatus according to the present invention will be described.

First of all, the configuration of the organic EL illuminating apparatus according to this embodiment will be described.

Figure 2:
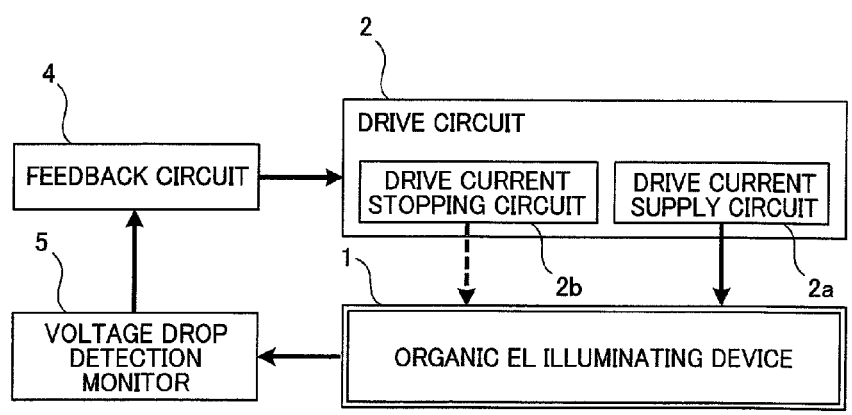
FIG. 2 is a schematic diagram showing a configuration of an organic EL illuminating apparatus according to a second embodiment of the present invention.

As shown in FIG. 2, the organic EL illuminating apparatus according to this embodiment includes: an organic EL illuminating device 1; a drive circuit 2 which drives the organic EL illuminating device 1; a voltage drop detection monitor 5 which detects voltage drop in the organic EL illuminating device 1; and a monitor detection signal feedback circuit 4 which outputs a signal to the drive circuit 2 on the basis of a signal from the voltage drop detection monitor 5. Moreover, the drive circuit 2 includes a drive current supply circuit 2a and a drive current stopping circuit 2b.

Next, the operation of the organic EL illuminating apparatus according to this embodiment will be described.

The organic EL illuminating apparatus according to this embodiment drives the organic EL illuminating device 1 by making the drive current supply circuit 2a of the drive circuit 2 supply a rated current to the organic EL illuminating device 1. In addition, the organic EL illuminating apparatus according to this embodiment makes the voltage drop detection monitor 5 monitor voltage drop in the driven organic EL illuminating device 1.

When a short-circuit occurs in a portion between anode and cathode in the organic EL illuminating device 1 due to some reason, the voltage of the organic EL illuminating device 1 drastically decreases. In the organic EL illuminating apparatus according to this embodiment, the voltage drop detection monitor 5 which monitors the voltage of the organic EL illuminating device 1 sends a voltage decrease signal to the monitor detection signal feedback circuit 4 when the voltage drop detection monitor 5 detects a voltage of a predetermined value or lower.

Further, the monitor detection signal feedback circuit 4 sends a voltage decrease signal to the drive circuit 2. Upon receipt of this signal, the drive circuit 2 makes the drive current stopping circuit 2b of the drive circuit 2 send a drive stop signal to the organic EL illuminating device 1 to turn off the organic EL illuminating device 1.

With the configuration described above, the organic EL illuminating apparatus according to this embodiment can detect a short-circuit as an anomaly when the short-circuit occurs in a portion between anode and cathode. This can prevent accidents such as a fire accident due to the Joule heat generated when an overload current is kept supplied to the organic EL illuminating device 1 in a state where there is a short-circuit in a portion of the device 1.

Third Embodiment

Hereinbelow, a third embodiment of the organic EL illuminating apparatus according to the present invention will be described.

First of all, the configuration of the organic EL illuminating apparatus according to this embodiment will be described.

Figure 3:
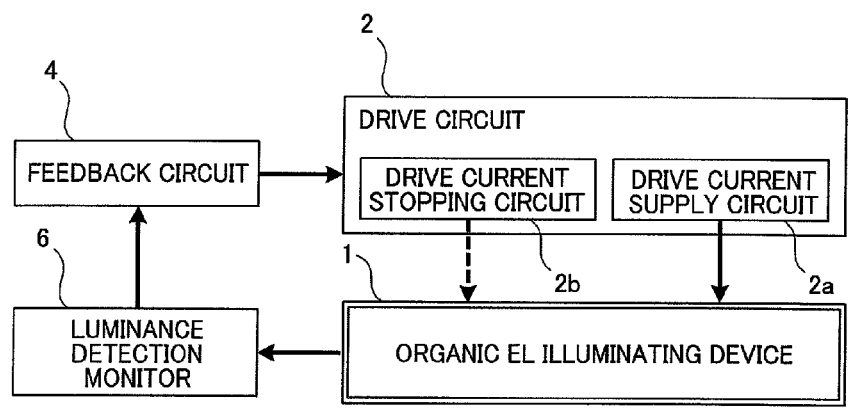
FIG. 3 is a schematic diagram showing a configuration of an organic EL illuminating apparatus according to a third embodiment of the present invention.

As shown in FIG. 3, the organic EL illuminating apparatus according to this embodiment includes: an organic EL illuminating device 1; a drive circuit 2 which drives the organic EL illuminating device 1; a luminance detection monitor 6 which detects the luminance of the organic EL illuminating device 1; and a monitor detection signal feedback circuit 4 which outputs a signal to the drive circuit 2 on the basis of a signal from the luminance detection monitor 6. Moreover, the drive circuit 2 includes a drive current supply circuit 2a and a drive current stopping circuit 2b. Note that the luminance detection monitor 6 may particularly measure the luminance of the front surface of the organic EL illuminating device 1.

Next, the operation of the organic EL illuminating apparatus according to this embodiment will be described.

The organic EL illuminating apparatus according to this embodiment drives the organic EL illuminating device 1 by making the drive current supply circuit 2a of the drive circuit 2 supply a rated current to the organic EL illuminating device 1. In addition, the organic EL illuminating apparatus according to this embodiment makes the luminance detection monitor 6 monitor the luminance of the driven organic EL illuminating device 1.

When a short-circuit occurs in a portion between anode and cathode in the organic EL illuminating device 1 due to some reason, the luminance of the organic EL illuminating device 1 drastically decreases. In the organic EL illuminating apparatus according to this embodiment, the luminance detection monitor 6 which monitors the luminance of the organic EL illuminating device 1 sends a luminance decrease signal to the monitor detection signal feedback circuit 4 when the luminance detection monitor 6 detects a luminance of a predetermined value or lower.

Further, the monitor detection signal feedback circuit 4 sends a luminance decrease signal to the drive circuit 2. Upon receipt of this signal, the drive circuit 2 makes the drive current stopping circuit 2b of the drive circuit 2 send a drive stop signal to the organic EL illuminating device 1 to turn off the organic EL illuminating device 1.

With the configuration described above, the organic EL illuminating apparatus according to this embodiment can detect a short-circuit as an anomaly when the short-circuit occurs in a portion between anode and cathode. This can prevent accidents such as a fire accident due to the Joule heat generated when an overload current is kept supplied to the organic EL illuminating device 1 in a state where there is a short-circuit in a portion of the device 1.

Fourth Embodiment

Hereinbelow, a fourth embodiment of the organic EL illuminating apparatus according to the present invention will be described.

First of all, the configuration of the organic EL illuminating apparatus according to this embodiment will be described.

Figure 4:
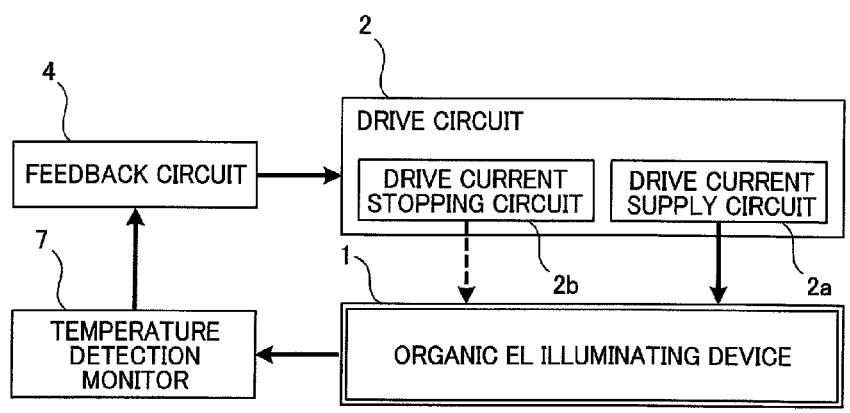
FIG. 4 is a schematic diagram showing a configuration of an organic EL illuminating apparatus according to a fourth embodiment of the present invention.

As shown in FIG. 4, the organic EL illuminating apparatus according to this embodiment includes: an organic EL illuminating device 1; a drive circuit 2 which drives the organic EL illuminating device 1; a temperature detection monitor 7 which detects the temperature of the organic EL illuminating device 1; and a monitor detection signal feedback circuit 4 which outputs a signal to the drive circuit 2 on the basis of a signal from the temperature detection monitor 7. Moreover, the drive circuit 2 includes a drive current supply circuit 2a and a drive current stopping circuit 2b. Note that the temperature detection monitor 7 may particularly measure the temperature of the front surface of the organic EL illuminating device 1.

Next, the operation of the organic EL illuminating apparatus according to this embodiment will be described.

The organic EL illuminating apparatus according to this embodiment drives the organic EL illuminating device 1 by making the drive current supply circuit 2a of the drive circuit 2 supply a rated current to the organic EL illuminating device 1. In addition, the organic EL illuminating apparatus according to this embodiment makes the temperature detection monitor 7 monitor the temperature of the driven organic EL illuminating device 1.

When a short-circuit occurs in a portion between anode and cathode in the organic EL illuminating device 1 due to some reason, the temperature of the organic EL illuminating device 1 drastically rises. In the organic EL illuminating apparatus according to this embodiment, the temperature detection monitor 7 which monitors the temperature of the organic EL illuminating device 1 sends a temperature rise signal to the monitor detection signal feedback circuit 4 when the temperature detection monitor 7 detects a temperature of a predetermined value or higher.

Further, the monitor detection signal feedback circuit 4 sends a temperature rise decrease signal to the drive circuit 2. Upon receipt of this signal, the drive circuit 2 makes the drive current stopping circuit 2b of the drive circuit 2 send a drive stop signal to the organic EL illuminating device 1 to turn off the organic EL illuminating device 1.

With the configuration described above, the organic EL illuminating apparatus according to this embodiment can detect a short-circuit as an anomaly when the short-circuit occurs in a portion between anode and cathode. This can prevent accidents such as a fire accident due to the Joule heat generated when an overload current is kept supplied to the organic EL illuminating device 1 in a state where there is a short-circuit in a portion of the device 1.

INDUSTRIAL APPLICABILITY

The present invention can be used, for example, for organic EL devices, particularly for organic EL illuminating devices which have a light-emission area of 20 cm$^2$ or larger or a light-emission area of 10 cm square or larger and emit light with a luminance of 1000 cd/m$^2$ or higher.

EXPLANATION OF REFERENCE NUMERALS

1 ORGANIC EL ILLUMINATING DEVICE
2 DRIVE CIRCUIT
2a DRIVE CURRENT SUPPLY CIRCUIT
2b DRIVE CURRENT STOPPING CIRCUIT
3 ILLUMINANCE DETECTION MONITOR
4 MONITOR DETECTION SIGNAL FEEDBACK CIRCUIT
5 VOLTAGE DROP DETECTION MONITOR
6 LUMINANCE DETECTION MONITOR
7 TEMPERATURE DETECTION MONITOR

The invention claimed is:

1. An organic EL illuminating apparatus including an organic EL illuminating device, characterized in that
the apparatus comprises:
drive circuit configured to drive the organic EL illuminating device with a constant, direct current drive;
voltage drop detection monitor configured to monitor and detect an anomaly in voltage drop, of the driven organic EL illuminating device that indicates a short-circuit in a portion between an anode and a cathode of the organic EL illuminating device; and feedback circuit configured to make the drive circuit turn off the organic EL illuminating device on the basis of monitoring information obtained by the monitor, wherein the voltage drop detection monitor sends a voltage decrease signal to the feedback circuit when the voltage drop detection monitor detects a voltage drop in the organic EL illuminating device to a predetermined value or lower.

2. The organic EL illuminating apparatus according to claim 1, characterized in that the organic EL illuminating device has a light-emission area of 20 cm$^2$ or larger and emits light with a luminance of 1000 cd/m$^2$ or higher.

3. The organic EL illuminating apparatus according to claim 1, characterized in that the organic EL illuminating device has a light-emission area of 10 cm square or larger and emits light with a luminance of 1000 cd/m$^2$ or higher.

* * * * *